(12) United States Patent
Han et al.

(10) Patent No.: US 12,262,597 B2
(45) Date of Patent: Mar. 25, 2025

(54) DISPLAY SUBSTRATE AND DISPLAY DEVICE

(71) Applicant: BOE TECHNOLOGY GROUP CO., LTD., Beijing (CN)

(72) Inventors: Ying Han, Beijing (CN); Pan Xu, Beijing (CN); Xing Zhang, Beijing (CN); Guangshuang Lv, Beijing (CN); Donghui Zhao, Beijing (CN); Chengyuan Luo, Beijing (CN); Cheng Xu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 18/282,106

(22) PCT Filed: Nov. 28, 2022

(86) PCT No.: PCT/CN2022/134711
§ 371 (c)(1),
(2) Date: Sep. 14, 2023

(87) PCT Pub. No.: WO2024/113102
PCT Pub. Date: Jun. 6, 2024

(65) Prior Publication Data
US 2025/0031531 A1 Jan. 23, 2025

(51) Int. Cl.
*H10K 59/124* (2023.01)
*G09G 3/00* (2006.01)
(Continued)

(52) U.S. Cl.
CPC ......... *H10K 59/124* (2023.02); *G09G 3/3225* (2013.01); *H10K 59/122* (2023.02);
(Continued)

(58) Field of Classification Search
CPC .. H10K 59/124; H10K 59/122; H10K 59/131; G09G 3/3225; G09G 3/003;
(Continued)

(56) References Cited

U.S. PATENT DOCUMENTS 5,824,437 A 10/1998 Sakakibara et al.
11,217,656 B2 * 1/2022 Li ..................... H10K 59/1216
(Continued)

FOREIGN PATENT DOCUMENTS

| CN | 102566112 A | 7/2012 |
|---|---|---|
| CN | 103329637 A | 9/2013 |

(Continued)

*Primary Examiner* — Vinh T Lam
(74) *Attorney, Agent, or Firm* — Scully, Scott, Murphy & Presser, P.C.

(57) ABSTRACT

A display substrate and a display device, the display substrate includes a base substrate, a pixel driving circuit layer, a first planarization layer, a first metal layer, a second planarization layer, a plurality of first electrodes and a pixel definition layer; the pixel driving circuit layer includes a plurality of pixel driving circuits, the first planarization layer includes a plurality of first vias respectively exposing output terminals of the pixel driving circuits, the first metal layer includes a plurality of data lines extending in a first direction, the pixel definition layer includes a plurality of first definition walls extending in the first direction and a plurality of second definition walls extending in a second direction, and an orthographic projection of at least part of the data lines on the base substrate respectively overlaps with orthographic projections of the plurality of first definition walls on the base substrate.

20 Claims, 9 Drawing Sheets

(51) Int. Cl.
*G09G 3/3225* (2016.01)
*H10K 59/122* (2023.01)
*H10K 59/131* (2023.01)

(52) U.S. Cl.
CPC .......... *H10K 59/131* (2023.02); *G09G 3/003* (2013.01); *G09G 2300/0426* (2013.01); *G09G 2300/0465* (2013.01); *G09G 2300/0819* (2013.01); *G09G 2300/0852* (2013.01); *G09G 2320/0233* (2013.01)

(58) Field of Classification Search
CPC ... G09G 2300/0426; G09G 2300/0465; G09G 2300/0819; G09G 2300/0852; G09G 2320/0233
See application file for complete search history.

(56) References Cited

U.S. PATENT DOCUMENTS

| | | | | |
|---|---|---|---|---|
| 11,437,457 | B2* | 9/2022 | Yang | H10K 59/131 |
| 11,444,132 | B2* | 9/2022 | Wu | H10K 59/1213 |
| 11,476,310 | B2* | 10/2022 | Wu | H10K 59/131 |
| 11,581,372 | B2* | 2/2023 | Wu | H10K 59/131 |
| 11,678,530 | B2* | 6/2023 | Liu | H01L 29/78672 |
| | | | | 257/40 |
| 11,735,108 | B2* | 8/2023 | Liu | H10K 59/352 |
| | | | | 345/214 |
| 11,747,949 | B2* | 9/2023 | Byun | G06F 3/0443 |
| | | | | 345/174 |
| 11,844,251 | B2* | 12/2023 | Qu | H10K 59/8051 |
| 11,864,432 | B2* | 1/2024 | Xu | H10K 59/131 |
| 11,877,482 | B2* | 1/2024 | Yuan | H10K 59/131 |
| 11,903,256 | B2* | 2/2024 | Yang | H10K 59/1216 |
| 11,910,680 | B2* | 2/2024 | Yuan | G09G 3/3266 |
| 11,937,480 | B2* | 3/2024 | Wu | H01L 27/1255 |
| 11,943,984 | B2* | 3/2024 | Dai | H10K 59/1216 |
| 11,957,008 | B2* | 4/2024 | Yang | H10K 59/353 |
| 11,972,727 | B2* | 4/2024 | Zhang | G09G 3/3233 |
| 11,974,473 | B2* | 4/2024 | Du | H10K 59/8723 |
| 11,985,874 | B2* | 5/2024 | Cai | H10K 59/121 |
| 12,057,069 | B2* | 8/2024 | Feng | G09G 3/3233 |
| 12,137,585 | B2* | 11/2024 | Zhang | H10K 59/131 |
| 2013/0099238 | A1 | 4/2013 | Chen et al. | |
| 2015/0187810 | A1 | 7/2015 | Lee | |
| 2015/0357392 | A1 | 12/2015 | You | |
| 2016/0284784 | A1 | 9/2016 | Lee et al. | |
| 2016/0291749 | A1 | 10/2016 | Zhou et al. | |
| 2018/0069194 | A1 | 3/2018 | Ono et al. | |
| 2018/0212008 | A1 | 7/2018 | Tang | |
| 2019/0005868 | A1 | 1/2019 | Xiao et al. | |
| 2019/0305221 | A1 | 10/2019 | Hou | |
| 2020/0105799 | A1 | 4/2020 | Yuan | |
| 2021/0175281 | A1 | 6/2021 | Choi | |
| 2021/0175459 | A1 | 6/2021 | Lee et al. | |
| 2021/0225974 | A1 | 7/2021 | Zeng et al. | |
| 2021/0376037 | A1 | 12/2021 | You | |
| 2022/0006011 | A1 | 1/2022 | Weng et al. | |
| 2022/0059517 | A1 | 2/2022 | Ikeda et al. | |
| 2022/0077262 | A1 | 3/2022 | Shin et al. | |
| 2022/0109032 | A1 | 4/2022 | Huang | |
| 2022/0216183 | A1 | 7/2022 | Wang et al. | |
| 2022/0254841 | A1 | 8/2022 | Zuo et al. | |
| 2022/0376007 | A1 | 11/2022 | Wang et al. | |
| 2022/0416195 | A1 | 12/2022 | Zhang et al. | |
| 2023/0021680 | A1 | 1/2023 | Li et al. | |
| 2023/0106276 | A1 | 4/2023 | Wang | |
| 2023/0298377 | A1 | 9/2023 | Hu | |
| 2023/0298509 | A1 | 9/2023 | Liu et al. | |
| 2024/0032355 | A1 | 1/2024 | Ding et al. | |

FOREIGN PATENT DOCUMENTS

| | | |
|---|---|---|
| CN | 104699351 A | 6/2015 |
| CN | 104749805 A | 7/2015 |
| CN | 106449705 A | 2/2017 |
| CN | 106654048 A | 5/2017 |
| CN | 106782398 A | 5/2017 |
| CN | 108281476 A | 7/2018 |
| CN | 109119028 A | 1/2019 |
| CN | 208368508 U | 1/2019 |
| CN | 110211974 A | 9/2019 |
| CN | 110611053 A | 12/2019 |
| CN | 110648916 A | 1/2020 |
| CN | 110970435 A | 4/2020 |
| CN | 111048529 A | 4/2020 |
| CN | 210429887 U | 4/2020 |
| CN | 111710694 A | 9/2020 |
| CN | 112071882 A | 12/2020 |
| CN | 112289812 A | 1/2021 |
| CN | 112951883 A | 6/2021 |
| CN | 112951892 A | 6/2021 |
| CN | 112992997 A | 6/2021 |
| CN | 113035905 A | 6/2021 |
| CN | 113725262 A | 11/2021 |
| CN | 113871440 A | 12/2021 |
| CN | 113903785 A | 1/2022 |
| CN | 114141825 A | 3/2022 |
| CN | 114241999 A | 3/2022 |
| CN | 114530464 A | 5/2022 |
| CN | 114759046 A | 7/2022 |
| CN | 114792766 A | 7/2022 |
| CN | 114974122 A | 8/2022 |
| CN | 115136317 A | 9/2022 |
| CN | 115732507 A | 3/2023 |
| CN | 115799272 A | 3/2023 |
| CN | 115831976 A | 3/2023 |
| JP | H09260244 A | 10/1997 |
| KR | 20180047295 A | 5/2018 |
| KR | 20200076191 A | 6/2020 |
| KR | 20210143520 A | 11/2021 |
| WO | 2018160019 A2 | 9/2018 |
| WO | 2022007494 A1 | 1/2022 |
| WO | 2022037466 A1 | 2/2022 |
| WO | 2022082491 A1 | 4/2022 |
| WO | 2022226846 A1 | 11/2022 |
| WO | 2022252024 A1 | 12/2022 |

* cited by examiner

DISPLAY SUBSTRATE AND DISPLAY DEVICE

CROSS-REFERENCE TO RELATED APPLICATION

This application is a U.S. National Phase of International Application No. PCT/CN2022/134711, filed on Nov. 28, 2022, the entire disclosure of which is incorporated herein by reference as part of the present application.

TECHNICAL FIELD

Embodiments of the present disclosure relate to a display substrate and a display device.

BACKGROUND

Ultra-high resolution display technology can improve the display effect of the display screen, and can also be applied to a variety of special displays, such as 3D display. During 3D display, the existing display pixels are divided into multiple views, and each view displays object information from different angles, which can realize 3D display in cooperation with micro lens. The more views, the better the 3D display effect. However, the more views, the higher the resolution, the smaller the sub-pixel size, and the lower the pixel aperture ratio, and the value of the pixel aperture ratio directly affects the lifetime of the display device.

SUMMARY

At least one embodiment of the present disclosure provides a display substrate, the display substrate comprises a base substrate, a pixel driving circuit layer, a first planarization layer, a first metal layer, a second planarization layer, a plurality of first electrodes, and a pixel definition layer; the pixel driving circuit layer is on the base substrate and comprises a plurality of pixel driving circuits, the first planarization layer is on a side of the pixel driving circuit layer away from the base substrate and comprises a plurality of first vias respectively exposing output terminals of the plurality of pixel driving circuits, the first metal layer is on a side of the first planarization layer away from the base substrate and comprises a plurality of data lines extending in a first direction and a plurality of connection electrodes, the plurality of connection electrodes are electrically connected with the output terminals of the plurality of pixel driving circuits through the first vias respectively, the second planarization layer is on a side of the first metal layer away from the base substrate and comprises a plurality of second vias exposing the plurality of connection electrodes, the plurality of first electrodes are on a side of the second planarization layer away from the base substrate, and electrically connected with the plurality of connection electrodes through the plurality of second vias respectively, the pixel definition layer is on a side of the plurality of first electrodes away from the base substrate and comprises a plurality of first definition walls extending in the first direction and a plurality of second definition walls extending in a second direction, wherein the plurality of first definition walls and the plurality of second definition walls define a plurality of pixel openings, and the first direction is different from the second direction, an orthographic projection of at least part of the plurality of data lines on the base substrate respectively at least partially overlaps with orthographic projections of the plurality of first definition walls on the base substrate.

For example, the display substrate provided by at least one embodiment of the present disclosure further comprises: a plurality of data connection lines, electrically connected with the plurality of data lines and the plurality of pixel driving circuits respectively; the plurality of data lines are electrically connected with the plurality of data connection lines through a plurality of third vias, and orthographic projections of the plurality of third vias on the base substrate respectively at least partially overlap with orthographic projections of the plurality of pixel openings on the base substrate.

For example, in the display substrate provided by at least one embodiment of the present disclosure, orthographic projections of the plurality of first vias on the base substrate are respectively within orthographic projections of the plurality of pixel openings on the base substrate.

For example, in the display substrate provided by at least one embodiment of the present disclosure, orthographic projections of the plurality of first vias on the base substrate are respectively within orthographic projections of the plurality of second definition walls on the base substrate.

For example, in the display substrate provided by at least one embodiment of the present disclosure, orthographic projections of the plurality of second vias on the base substrate are respectively within orthographic projections of the plurality of second definition walls on the base substrate.

For example, in the display substrate provided by at least one embodiment of the present disclosure, in a direction perpendicular to the base substrate, a height of the plurality of first definition walls is smaller than a height of the plurality of second definition walls.

For example, the display substrate provided by at least one embodiment of the present disclosure further comprises: a light-emitting material layer, at least in the plurality of pixel openings and comprising a plurality of light-emitting material rows with different colors; the plurality of light-emitting material rows extend in the second direction and are separated from each other by the plurality of second definition walls.

For example, in the display substrate provided by at least one embodiment of the present disclosure, each of the plurality of pixel driving circuits comprises a first thin film transistor and a first storage capacitor, the first thin film transistor comprises a first gate electrode, a first source electrode and a first drain electrode, and the first storage capacitor comprises a first capacitor electrode and a second capacitor electrode, the first gate electrode is electrically connected with a first scanning signal line, the first source electrode is electrically connected with one of the plurality of data lines, the first drain electrode is electrically connected with the first capacitor electrode, and the second capacitor electrode is electrically connected with one of the plurality of first electrodes.

For example, in the display substrate provided by at least one embodiment of the present disclosure, the first gate electrode and the first capacitor electrode are in a same layer on the base substrate, the display substrate further comprises a gate insulation layer on a side of both the first gate electrode and the first capacitor electrode away from the base substrate, the second capacitor electrode is on a side of the gate insulation layer away from the base substrate, the display substrate further comprises an interlayer insulation layer on a side of the second capacitor electrode away from the base substrate, the first source electrode and the first drain electrode are on a side of the interlayer insulation layer away from the base substrate, and the first planarization layer is on a side of both the first source electrode and the first drain electrode away from the base substrate.

For example, in the display substrate provided by at least one embodiment of the present disclosure, the plurality of data connection lines are in a same layer as the first source electrode and the first drain electrode;

For example, in the display substrate provided by at least one embodiment of the present disclosure, the first scanning signal line is in a same layer as the first source electrode and the first drain electrode.

For example, in the display substrate provided by at least one embodiment of the present disclosure, the first scanning signal line is electrically connected with the first gate electrode through a fourth via, an orthographic projection of the fourth via on the base substrate is within orthographic projections of the plurality of pixel openings on the base substrate.

For example, in the display substrate provided by at least one embodiment of the present disclosure, each of the plurality of pixel driving circuits further comprises a second thin film transistor, the second thin film transistor comprises a second gate electrode, a second source electrode and a second drain electrode, the second gate electrode is electrically connected with a second scanning signal line, the second source electrode is electrically connected with the first drain electrode and the first capacitor electrode, the second drain electrode is electrically connected with a reference voltage line.

For example, in the display substrate provided by at least one embodiment of the present disclosure, the reference voltage line is arranged in the first metal layer and extends in the first direction.

For example, the display substrate provided by at least one embodiment of the present disclosure further comprises: a reference voltage connection line, respectively electrically connected with the reference voltage line and the second drain electrode, wherein the reference voltage connection line is in a same layer as the first source electrode and the first drain electrode.

For example, in the display substrate provided by at least one embodiment of the present disclosure, the reference voltage connection line is electrically connected with the reference voltage line through a fifth via, an orthographic projection of the fifth via on the base substrate at least partially overlaps with orthographic projections of the plurality of first definition walls on the base substrate.

For example, in the display substrate provided by at least one embodiment of the present disclosure, each of the plurality of pixel driving circuits further comprises a third thin film transistor, the third thin film transistor comprises a third gate electrode, a third source electrode and a third drain electrode, the third gate electrode is electrically connected with a third scanning signal line, the third source electrode is electrically connected with the second capacitor electrode and one of the plurality of first electrodes, the third drain electrode is electrically connected with a reset voltage line.

For example, in the display substrate provided by at least one embodiment of the present disclosure, the reset voltage line is in the first metal layer and extends in the first direction.

For example, the display substrate provided by at least one embodiment of the present disclosure further comprises: a reset voltage connection line, electrically connected with the reset voltage line and the third drain electrode respec-
tively, the reset voltage connection line is in a same layer as the first source electrode and the first drain electrode.

For example, in the display substrate provided by at least one embodiment of the present disclosure, the reset voltage connection line is electrically connected with the reset voltage line through a sixth via, an orthographic projection of the sixth via on the base substrate at least partially overlaps with orthographic projections of the plurality of second definition walls on the base substrate.

For example, in the display substrate provided by at least one embodiment of the present disclosure, each of the plurality of pixel driving circuits further comprises a fourth thin film transistor and a fifth thin film transistor, the fourth thin film transistor comprises a fourth gate electrode, a fourth source electrode and a fourth drain electrode, and the fifth thin film transistor comprises a fifth gate electrode, a fifth source electrode and a fifth drain electrode, the fourth gate electrode is electrically connected with a light-emitting control line, the fourth source electrode is electrically connected with the fifth drain electrode, the fourth drain electrode is electrically connected with a first power line, the fifth gate electrode is electrically connected with the first drain electrode and the first capacitor electrode, the fifth source electrode is electrically connected with the second capacitor electrode and one of the plurality of first electrodes.

For example, in the display substrate provided by at least one embodiment of the present disclosure, the first power line is in the first metal layer and extends in the first direction.

For example, the display substrate provided by at least one embodiment of the present disclosure further comprises: a first power connection line, electrically connected with the first power line and the fourth drain electrode respectively, the first power connection line is in a same layer as the first source electrode and the first drain electrode.

For example, in the display substrate provided by at least one embodiment of the present disclosure, the first power connection line is electrically connected with the first power line through a seventh via, an orthographic projection of the seventh via on the base substrate at least partially overlaps with orthographic projections of the plurality of first definition walls on the base substrate.

For example, the display substrate provided by at least one embodiment of the present disclosure further comprises a plurality of sub-pixels, at least one of the sub-pixels comprises N pixel driving circuits in a same row, and the N pixel driving circuits correspond to N views, and N is a positive integer greater than 1.

For example, in the display substrate provided by at least one embodiment of the present disclosure, M columns of pixel driving circuits constitute a repetition unit, the M columns of pixel driving circuits of at least one repetition unit share one reset voltage line and one reference voltage line, and M is a positive integer greater than 1.

At least one embodiment of the present disclosure provides a display device, the display device includes the display substrate provided by at least one embodiment of the present disclosure.

BRIEF DESCRIPTION OF DRAWINGS

In order to clearly illustrate the technical solution of the embodiments of the present disclosure, the drawings of the embodiments will be briefly described in the following; it is obvious that the described drawings are only related to some embodiments of the present disclosure and thus are not limitative of the present disclosure.

DETAILED DESCRIPTION

Figure 1:
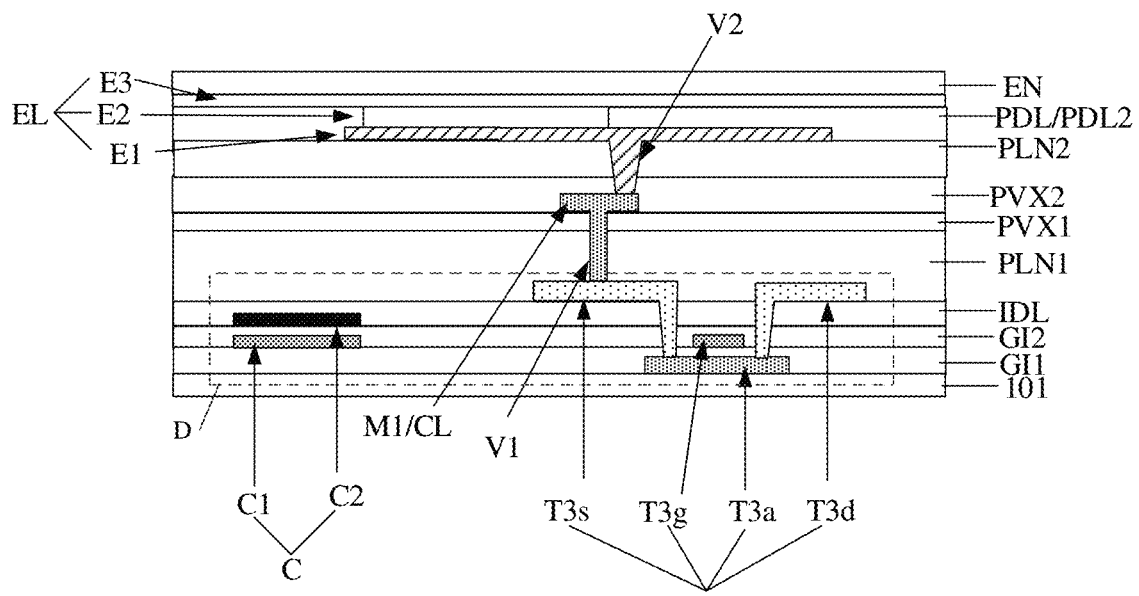
FIG. 1 is a cross-sectional schematic view of a part of a display substrate provided by at least one embodiment of the present disclosure.

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. Also, the terms "comprise," "comprising," "include," "including." etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On." "under," "left." "right" and the like are only used to indicate relative position relationship, and when the position of the object which is described is changed, the relative position relationship may be changed accordingly.

As mentioned above, during 3D display, the existing display pixels are divided into multiple views, and each view displays object information from different angles, which can realize 3D display in cooperation with micro lens. The more views, the better the 3D display effect. However, the more views, the higher the resolution, the smaller the sub-pixel size, and the lower the pixel aperture ratio, and the value of the pixel aperture ratio directly affects the lifetime of the display device. In addition, for the internal compensation pixel circuit of the organic light-emitting diode (OLED) display device, the lower the pixel aperture ratio, the smaller the intrinsic capacitance of the OLED device, and the greater the loss of gray scale in the data writing stage. In addition, for the process of printing the light-emitting layer of the OLED light-emitting device, the size of the height difference of layers at the bottom of the OLED light-emitting device directly affects the light-emitting performance of OLED light-emitting device. Therefore, how to design a display substrate that can achieve ultra-high resolution by comprehensively considering the above factors is the main research topic of technicians in this field.

At least one embodiment of the present disclosure provides a display substrate and a display device, the display substrate includes a base substrate, a pixel driving circuit layer, a first planarization layer, a first metal layer, a second planarization layer, a plurality of first electrodes and a pixel definition layer; the pixel driving circuit layer is on the base substrate and includes a plurality of pixel driving circuits, the first planarization layer is on a side of the pixel driving circuit layer away from the base substrate, and includes a plurality of first vias respectively exposing output terminals of the plurality of pixel driving circuits, the first metal layer is on a side of the first planarization layer away from the base substrate, and includes a plurality of data lines extending in a first direction and a plurality of connection electrodes, the plurality of connection electrodes are electrically connected with the output terminals of the plurality of pixel driving circuits through the first vias respectively, the second planarization layer is on a side of the first metal layer away from the base substrate and includes a plurality of second vias exposing the plurality of connection electrodes, the plurality of first electrodes are on a side of the second planarization layer away from the base substrate, and are electrically connected with the plurality of connection electrodes through the plurality of second vias respectively, the pixel definition layer is on a side of the plurality of first electrodes away from the base substrate and includes a plurality of first definition walls extending in the first direction and a plurality of second definition walls extending in a second direction, the plurality of first definition walls and the plurality of second definition walls define a plurality of pixel openings, and the first direction is different from the second direction; an orthographic projection of at least part of the plurality of data lines on the base substrate respectively at least partially overlaps with orthographic projections of the plurality of first definition walls on the base substrate.

In the display substrate provided by at least one embodiment of the present disclosure, at least part of the plurality of data lines at least partially overlaps with the plurality of first definition walls, so that vias connecting the plurality of data lines and other circuits can be uniformly distributed at the plurality of first definition walls, thereby ensuring the uniformity of the bottom of the light-emitting device while increasing the pixel aperture ratio, and contributing to improving the display uniformity of the display substrate and realizing high resolution.

In the following, the display substrate and the display device provided by the embodiments of the present disclosure are described in detail through several specific embodiments.

Figure 2:
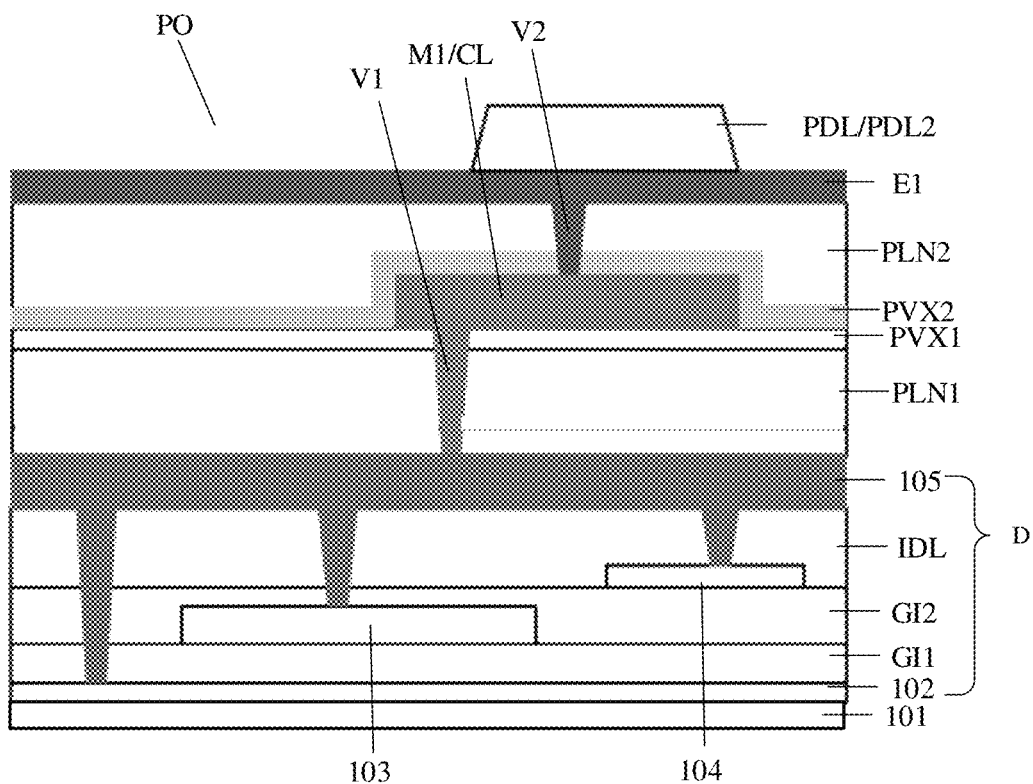
FIG. 2 is a schematic cross-sectional view of another part of the display substrate provided by at least one embodiment of the present disclosure.
Figure 3:
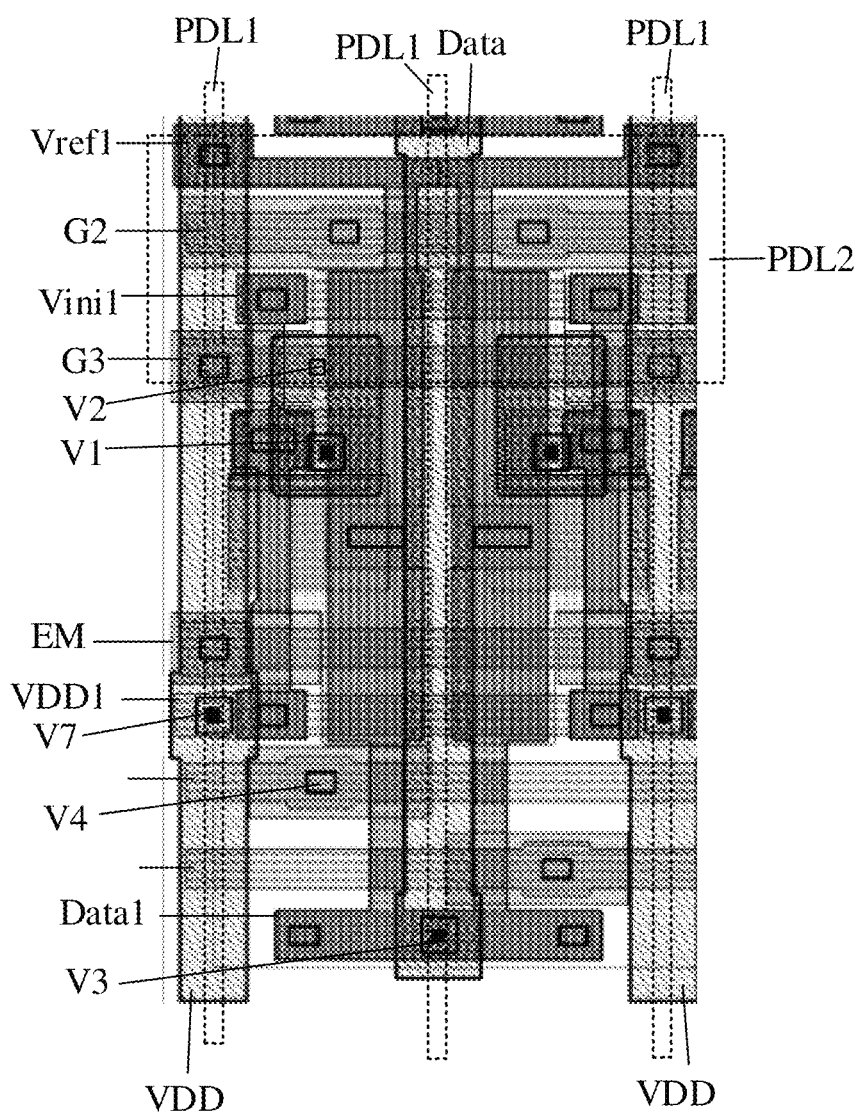
FIG. 3 is a partial planar view of the display substrate provided by at least one embodiment of the present disclosure.

At least one embodiment of the present disclosure provides a display substrate, FIG. 1 and FIG. 2 respectively show schematic cross-sectional views of the display substrate at different positions, and FIG. 3 shows a schematic planar view of a part of the display substrate, for example, a schematic planar view showing two adjacent pixel driving circuits. As shown in FIGS. 1-3, the display substrate includes a base substrate 101, a pixel driving circuit layer D, a first planarization layer PLN1, a first metal layer M1, a second planarization layer PLN2, a plurality of first electrodes E1 and a pixel definition layer PDL.

The pixel driving circuit layer D is arranged on the base substrate 101 and includes a plurality of pixel driving circuits, such as 2T1C (including two thin film transistors and one storage capacitor) pixel driving circuits, 3T1C pixel driving circuits, 5T1C pixel driving circuits, 5T2C pixel driving circuits, 7T1C pixel driving circuits, 8T2C pixel driving circuits or 9T2C pixel driving circuits, which will be described in detail later.

The first planarization layer PLN1 is arranged on the side of the pixel driving circuit layer D away from the base substrate 101 for planarizing the pixel driving circuit layer D, and the first planarization layer PLN1 includes a plurality of first vias V1 respectively exposing output terminals of the pixel driving circuits.

The first metal layer M1 is arranged on the side of the first planarization layer PLN1 away from the base substrate 101, and includes a plurality of data lines Data extending in a first direction (the vertical direction in FIG. 3) and a plurality of connection electrodes CL, and the plurality of connection electrodes CL are respectively electrically connected with the output terminals of the plurality of pixel driving circuits D through the first vias V1.

The second planarization layer PLN2 is arranged on the side of the first metal layer M1 away from the base substrate 101, and includes a plurality of second vias V2 exposing the plurality of connection electrodes CL.

The plurality of first electrodes E1 are arranged on the side of the second planarization layer PLN2 away from the base substrate 101, and are respectively electrically connected with the plurality of connection electrodes CL through the plurality of second vias V2, so as to be electrically connected with the output terminals of the plurality of pixel driving circuits.

Figure 4:
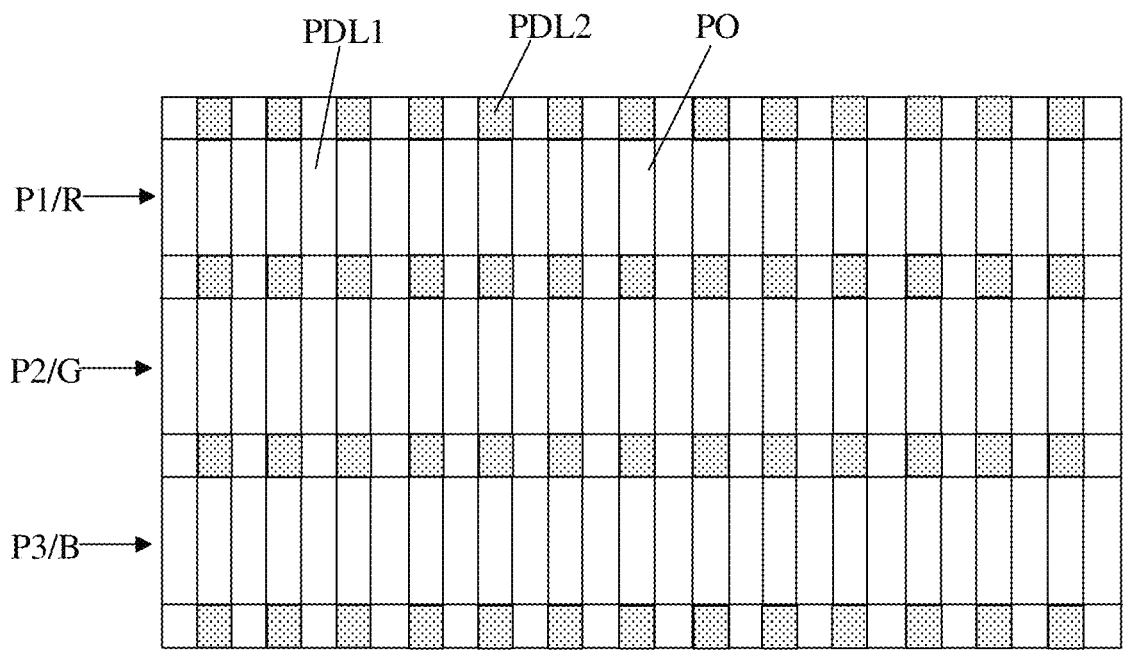
FIG. 4 is a planar view of a part of a pixel definition layer of the display substrate provided by at least one embodiment of the present disclosure.

The pixel definition layer PDL is arranged on the side of a plurality of first electrodes E1 away from the base substrate 101. FIG. 4 shows a schematic planar view of the pixel definition layer PDL, as shown in FIG. 4, the pixel definition layer PDL includes a plurality of first definition walls PDL1 extending in the first direction (the vertical direction in the figure) and a plurality of second definition walls PDL2 extending in a second direction, the plurality of first definition walls PDL1 and the plurality of second definition walls PDL2 define a plurality of pixel openings PO, the first direction is different from the second direction, for example, the first direction is perpendicular to the second direction.

In FIG. 3, the dotted frame shows the position in which the first definition walls PDL1 and the second definition walls PDL2 are stacked. As shown in FIG. 3, the orthographic projection of at least a part of the plurality of data lines Data on the base substrate 101 respectively overlaps with the orthographic projections of the plurality of first definition walls PDL1 on the base substrate 101.

That is, in some embodiments of the present disclosure, the first definition wall PDL1 and the data line Data extend in the same direction, that is, the above-mentioned first direction, and the first definition wall PDL1 and the data line Data are at least partially overlapped, for example, mostly overlapped, in the direction perpendicular to the base substrate 101.

For example, in some embodiments, as shown in FIG. 3, the display substrate further includes a plurality of data connection lines Data1, the plurality of data connection lines Data1 are respectively electrically connected with the plurality of data lines Data and the plurality of pixel driving circuits D, so as to electrically connect the plurality of data lines Data and the plurality of pixel driving circuits D. For example, the plurality of data lines Data and the plurality of data connection lines Data1 are respectively arranged in different metal layers, and the plurality of data lines Data are electrically connected with the plurality of data connection lines Data1 through a plurality of third vias V3. For example, the orthographic projections of the plurality of third vias V3 on the base substrate 101 respectively at least partially overlap with the orthographic projections of the plurality of pixel openings PO on the base substrate 101.

For example, the orthographic projections of the plurality of third vias V3 on the base substrate 101 also at least partially overlap with the orthographic projections of the plurality of first definition walls PDL1 on the base substrate 101, but due to the narrow width of the first definition walls PDL1, the orthographic projections of the plurality of third vias V3 on the base substrate 101 also at least partially overlap with the orthographic projections of the plurality of pixel openings PO on the base substrate 101. That is, the opening range of the plurality of pixel openings PO extends beyond the plurality of third vias V3, and therefore the plurality of pixel openings PO have a larger opening area, thereby improving the aperture ratio of the sub-pixels; on the other hand, a second planarization layer PLN2 is further provided on the first planarization layer PLN1, the second planarization layer PLN2 can also planarize the first planarization layer PLN1, so that the bottom of the pixel opening PO is relatively flat. In another aspect, each pixel opening PO on the display substrate is designed like this, so that the flatness of the bottom of each pixel opening PO is basically the same, thereby improving the light-emitting uniformity of the display substrate.

For example, in some embodiments, the orthographic projections of the plurality of first vias V1 on the base substrate 101 are respectively located within the orthographic projections of the plurality of pixel openings PO on the base substrate 101. That is, the opening range of the plurality of pixel openings PO extends beyond the plurality of first vias V1, so as to obtain a larger opening area and improve the aperture ratio of the sub-pixels.

For example, in other embodiments, the orthographic projections of the plurality of first vias V1 on the base substrate 101 may be respectively located in the orthographic projections of the plurality of second definition walls PDL2 on the base substrate 101, so as to increase the flatness of the bottom of the pixel opening PO.

For example, in some embodiments, the orthographic projections of the plurality of second vias V2 on the base substrate 101 are respectively located within the orthographic projections of the plurality of second definition walls PDL2 on the base substrate 101. That is, the plurality of second vias V2 are not exposed by the plurality of pixel openings PO. Because the plurality of second vias V2 are formed in the second planarization layer PLN2, no planarization layer is provided on the second planarization layer PLN2, the positions of the second vias V2 are relatively uneven, by arranging the second vias V2 under the second definition walls PDL2 and not being exposed by the pixel openings PO, the flatness of the bottom of the pixel openings PO can be improved, which is beneficial to improving the light-emitting uniformity of the display substrate.

For example, in some embodiments, in the direction perpendicular to the base substrate 101, the heights of the plurality of first definition walls PDL1 are smaller than the heights of the plurality of second definition walls PDL2. For example, in some examples, the first defining wall PDL1 is higher than the second defining wall PDL2 by about 1.0 microns. For example, the height of the second defining wall PDL2 may be in a range of about 1.2 microns to 2.0 microns, such as 1.5 microns, and the height of the first defining wall PDL1 may be in a range of about 0.2 microns to 1.0 microns, such as 0.5 microns, etc.

For example, in some embodiments, the display substrate further includes a light-emitting material layer E2. Referring to FIGS. 1 and 4, the light-emitting material layer E2 is at least arranged in the plurality of pixel openings PO, the light-emitting material layer E2 includes a plurality of light-emitting material rows with different colors. In FIG. 4, three rows of light-emitting material rows P1/P2/P3 are shown as an example, and the plurality of light-emitting material rows P1/P2/P3 extend in the second direction (the horizontal direction in the figure) and are separated from each other by the plurality of second definition walls PDL2.

For example, light-emitting materials of the plurality of light-emitting material rows P1/P2/P3 are different, so that the plurality of light-emitting material rows can emit light of different colors. For example, in some examples, the light-emitting material row P1 adopts a red light-emitting material R, so as to emit red light; the light-emitting material row P2 adopts a green light-emitting material G, so as to emit green light; the light-emitting material row P3 adopts a blue light-emitting material B, so as to emit blue light. In the first direction, the plurality of light-emitting material rows P1/P2/P3 are separated from each other by the second defining walls PDL2 which have a higher height, so as to prevent the light-emitting materials of different colors from flowing into each other and causing crosstalk during the preparation of the display substrate, for example, during the process in which the light-emitting materials of the plurality of light-emitting material rows P1/P2/P3 are printed. In the second direction, the plurality of pixel openings PO corresponding to each light-emitting material row P1/P2/P3 are separated from each other by the first defining walls PDL1 which have a lower height. During the preparation of the display substrate, for example, during the process in which the light-emitting materials of each light-emitting material row P1/P2/P3 are printed, the light-emitting materials between different pixel openings PO of each light-emitting material row P1/P2/P3 may flow, and finally reach a balance, and after the light-emitting materials are dried, the light-emitting materials can be uniformly formed at least in each pixel opening PO.

For example, referring to FIG. 1, the display substrate further includes a second electrode layer E3 arranged on the side of the light-emitting material layer E2 away from the base substrate 101. For example, the first electrode E1, the light-emitting material layer E2 and the second electrode layer E3 constitute a light-emitting device EL, such as an organic light-emitting device (OLED). For example, the second electrode layer E3 may be an electrode layer which is formed as an integral surface structure in the display substrate, that is, the second electrode layers E3 of a plurality of light-emitting devices EL are arranged continuously.

For example, referring to FIG. 1, the display substrate further includes an encapsulation layer EN disposed on the side of the second electrode layer E3 away from the base substrate 101. For example, the encapsulation layer EN may be a composite encapsulation layer, including a stacked structure of a plurality of organic encapsulation layers and inorganic encapsulation layers, so as to provide a better encapsulation effect for the display substrate.

For example, in some embodiments, the display substrate includes a plurality of sub-pixels, and at least one sub-pixel (for example, each sub-pixel) includes N pixel driving circuits located in one same row, the N pixel driving circuits correspond to N views, and N is a positive integer greater than 1. As an example, two sub-pixels, that is, two views, are shown in FIG. 3.

Figure 5:
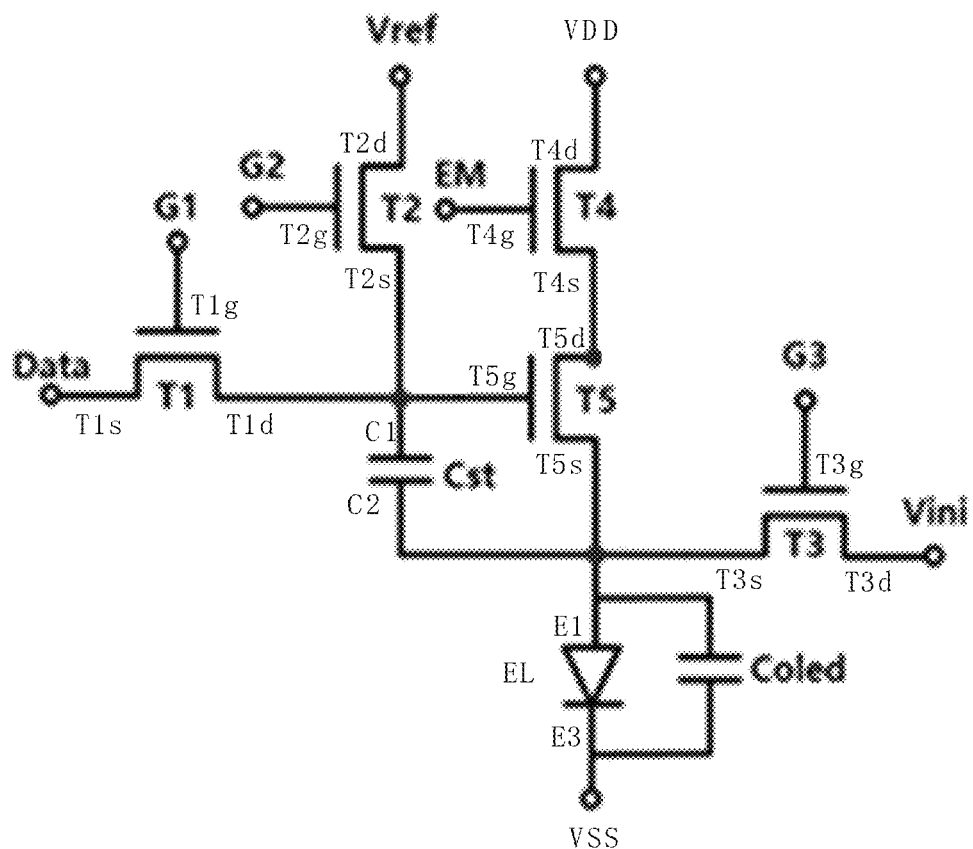
FIG. 5 is a pixel circuit diagram of the display substrate provided by at least one embodiment of the present disclosure.

For example, each pixel driving circuit is connected with a light-emitting device EL to drive the light-emitting device EL. For example, when performing 3D display, the light-emitting device EL corresponding to the required view among the N views of each sub-pixel is driven to be lit by the corresponding pixel driving circuit to perform corresponding display. For example, in some embodiments, the pixel driving circuit may adopt a 5T2C pixel driving circuit, that is, the pixel driving circuit includes five thin film transistors and two capacitors. FIG. 5 shows a circuit diagram of the 5T2C pixel driving circuit.

For example, in some embodiments, as shown in FIG. 5, each pixel driving circuit includes a first thin film transistor T1 and a first storage capacitor Cst, the first thin film transistor T1 includes a first gate electrode T1g, a first source electrode T1s and a first drain electrode T1d, the first storage capacitor Cst includes a first capacitor electrode C1 and a second capacitor electrode C2, the first gate electrode T1g is electrically connected with a first scanning signal line G1, the first source electrode T1s is electrically connected with one of the plurality of data lines Data, the first drain electrode T1d is electrically connected with the first capacitor electrode C1, and the second capacitor electrode C2 is electrically connected with one of the plurality of first electrodes E1.

For example, each pixel driving circuit further includes a second thin film transistor T2, the second thin film transistor T2 includes a second gate electrodeT2g, a second source electrode T2s and a second drain electrode T2d, the second gate electrode T2g is electrically connected with a second scanning signal line G2, the second source electrode T2s is electrically connected with the first drain electrode T1d and the first capacitor electrode C1, and the second drain electrode T2d is electrically connected with a reference voltage line Vref.

For example, each pixel driving circuit further includes a third thin film transistor T3, the third thin film transistor T3 includes a third gate electrode T3g, a third source electrode T3s and a third drain electrode T3d, the third gate electrode T3g is electrically connected with a third scanning signal line G3, the third source electrode T3s is electrically connected with the second capacitor electrode C2 and one of the plurality of first electrodes E1, and the third drain electrode T3d is electrically connected with a reset voltage line Vini.

For example, each pixel driving circuit further includes a fourth thin film transistor T4 and a fifth thin film transistor T5, the fourth thin film transistor T4 includes a fourth gate electrode T4g, a fourth source electrode T4s and a fourth drain electrode T4d, the fifth thin film transistor T5 includes a fifth gate electrode T5g, a fifth source electrode T5s and a fifth drain electrode T5d, the fourth gate electrode T4g is electrically connected with a light-emitting control line EM, and the fourth source electrode T4s is electrically connected with the fifth drain electrode T5d, the fourth drain electrode T4d is electrically connected with a first power line VDD, the fifth gate electrode T5g is electrically connected with the first drain electrode T1d and the first capacitor electrode C1, and the fifth source electrode T5s is electrically connected with the second capacitor electrode C2 and one of the plurality of first electrodes E1.

For example, the second electrode layers E3 of the plurality of light-emitting devices EL are connected with a second power line VSS. The first electrode E1 and the second electrode layer E3 of the light-emitting device EL further form a second storage capacitor Coled, the second storage capacitor Coled is also the intrinsic capacitance of the light-emitting device EL.

For example, in some embodiments, the first power line VDD is a power line that provides a high level voltage on the display substrate, and the second power line VSS is a power line that provides a ground level voltage. For example, in some examples, the second power line VSS may also provide a ground voltage.

For example, in the embodiments of the present disclosure, the source electrode and the drain electrode of each transistor are symmetrical in structure, and the functions and connection modes of the source electrode and the drain electrode can be interchanged.

For example, in the stacked structure of the display substrate, the gate electrodes of the first to fifth thin film transistors T1~T5 are arranged in the same layer, and the source electrodes and the drain electrodes of the first to fifth thin film transistors T1~T5 are arranged in the same layer.

It should be noted that in the embodiments of the present disclosure, "in the same layer" means that two (or more) functional layers or structural layers are in the same layer and formed of the same material in the stacked structure of the display substrate, that is, in the preparation process of the display substrate, the two (or more) functional layers or structural layers can be formed of the same material layer, and the required patterns and structures can be formed by the same one patterning process.

For example, referring to FIG. 1 and FIG. 2, the first to fifth gate electrodes T1g~T5g (the third gate electrode T3g is shown in the figure) and the first capacitor electrode C1 are arranged in the same layer on the base substrate 101, such as in a first gate metal layer 103 in the display substrate; the display substrate further includes a gate insulation layer G12 arranged on the side of all of the first to the fifth gate electrodes T1g~T5g and the first capacitor electrode C1 away from the base substrate 101, and the second capacitor electrode C2 is arranged on the side of the gate insulation layer G12 away from the base substrate 101, such as in a second gate metal layer 104 in the display substrate. The display substrate further includes an interlayer insulation layer IDL arranged on the side of the second capacitor electrode C2 away from the base substrate 101, and all of the first to the fifth source electrodes T1s~T5s and the first to the fifth drain electrodes T1d~T5d are arranged on the side of the interlayer insulation layer IDL away from the base substrate 101, such as in a first source-drain electrode layer 105 in the display substrate; the first planarization layer PDL1 is arranged on the side of all of the first to the fifth source electrodes T1s~T5s and the first to the fifth drain electrodes T1d~T5d away from the base substrate 101.

For example, referring to FIG. 1 and FIG. 2, the first to fifth transistors T1~T5 further respectively include a first to a fifth active layers T1a~T5a, and the first to the fifth active layers T1a~T5a are respectively arranged on the side of the first to the fifth gate electrodes T1g~T5g close to the base substrate 101 (as shown in the figure) or away from the base substrate 101, for example, in a semiconductor layer 102 in the display substrate, so as to form top gate type thin film transistors or bottom gate type thin film transistors. For example, the display substrate further includes another gate insulation layer G11 arranged on the side of all of the first to the fifth active layers T1a~T5a away from the base substrate 101 to insulate the semiconductor layer 102 and the first gate metal layer 103.

For example, in some embodiments, referring to FIG. 1 and FIG. 2, the display substrate may further include a first passivation layer PVX1 arranged on the side of the first metal layer M1 close to the base substrate 101 and a second passivation layer PVX2 arranged on the side of the first metal layer M1 away from the base substrate 101, and for example, the first passivation layer PVX1 and the second passivation layer PVX2 may be made of an inorganic insulating material, such as silicon oxide, silicon nitride or silicon oxynitride.

For example, in some embodiments, the plurality of data connection lines Data1 are arranged in the same layer as the first to the fifth source electrodes T1s~T5s and the first to the fifth drain electrodes T1d~T5d, that is, in the first source-drain metal layer 105.

For example, in some embodiments, the first scanning signal line G1 is arranged in the same layer as the first to the fifth source electrodes T1s~T5s and the first to the fifth drain electrodes T1d~T5d, that is, in the first source-drain metal layer 105.

For example, in some embodiments, the first scanning signal line G1 includes a first scanning signal line G11 that provides first scanning signals for odd-numbered columns of pixel driving circuits and a first scanning signal line G12 that provides first scanning signals for even-numbered columns of pixel driving circuits, and the first scanning signal line G11 and the first scanning signal line G12 are adjacent to each other.

For example, referring to FIG. 3, the first scanning signal line G1 is electrically connected with the first gate electrode T1g through a fourth via V4, and the orthographic projections of a plurality of fourth vias V4 on the base substrate 101 are respectively within the orthographic projections of the plurality of pixel openings PO on the base substrate 101. Therefore, the ranges of the plurality of pixel openings PO respectively extend beyond the fourth vias V4, so as to achieve a larger opening area and improve the aperture ratio.

For example, in some embodiments, the reference voltage line Vref is arranged in the first metal layer M1 and extends in the first direction, that is, the extension direction of the reference voltage line Vref is the same as the extension direction of the data line Data, which is described in detail later.

For example, referring to FIG. 3, the display substrate further includes a reference voltage connection line Vref1, the reference voltage connection line Vref1 is respectively electrically connected with the reference voltage line Vref and the second drain electrode T2s, so as to electrically connect the reference voltage line Vref and the second drain electrode T2s. For example, the reference voltage connection line Vref1 is arranged in the same layer as all of the first to the fifth source electrodes T1s~T5s and the first to the fifth drain electrodes T1d~T5d, that is, in the first source-drain metal layer 105.

For example, the reference voltage connection line Vref1 is electrically connected with the reference voltage line Vref through a fifth via V5 (refer to FIG. 11, which is described in detail later), and the orthographic projections of a plurality of fifth vias V5 on the base substrate 101 respectively at least partially overlap with the orthographic projections of the plurality of first definition walls PDL1 on the base substrate 101. For example, in some embodiments, the orthographic projections of the plurality of fifth via V5 on the base substrate 101 also respectively at least partially overlap with the orthographic projections of the plurality of pixel openings PO on the base substrate 101. Therefore, the ranges of the plurality of pixel openings PO respectively extend beyond the fifth viasV5, so as to achieve a larger opening area and improve the aperture ratio.

For example, in some embodiments, the reset voltage line Vini is arranged in the first metal layer M1 and extends in the first direction, that is, the extension direction of the reset voltage line Vini is the same as the extension direction of the data line Data, which is described in detail later.

For example, referring to FIG. 3, the display substrate further includes a reset voltage connection line Vini1, the reset voltage connection line Vini1 is respectively electrically connected with the reset voltage line Vini and the third drain electrode T3d, so as to electrically connect the reset voltage line Vini and the third drain electrode T3d, and the reset voltage connection line Vini is arranged in the same layer as all of the first to the fifth source electrodes T1s~T5s and the first to the fifth drain electrodes T1d~T5d, that is, in the first source-drain metal layer 105.

For example, the reset voltage connection line Vini1 is electrically connected with the reset voltage line Vini through a sixth via V6 (refer to FIG. 11, which is described in detail later), and the orthographic projections of a plurality of sixth vias V6 on the base substrate 101 respectively at least partially overlap with the orthographic projections of the plurality of second definition walls PDL2 on the base substrate 101. For example, in some embodiments, the orthographic projections of the plurality of sixth vias V6 on the base substrate 101 are respectively located within the orthographic projections of the plurality of second definition walls PDL2 on the base substrate 101, so that the plurality of sixth vias V6 are not to be exposed by the plurality of pixel openings PO.

For example, in some embodiments, the first power line VDD is arranged in the first metal layer M1 and extends in the first direction, that is, the extension direction of the first power line VDD is the same as the extension direction of the data line Data, which is described in detail later.

For example, referring to FIG. 3, the display substrate further includes a first power connection line VDD1, the first power connection line VDD1 is respectively electrically connected with the first power line VDD and the fourth drain electrode T4d, so as to electrically connect the first power line VDD and the fourth drain electrode T4d. For example, the first power connection line VDD1 is arranged in the same layer as all of the first to the fifth source electrodes T1s~T5s and the first to the fifth drain electrodes T1d~T5d, that is, in the first source-drain metal layer 105.

For example, the first power connection line VDD1 is electrically connected with the first power line VDD through a seventh via V7, and the orthographic projections of a plurality of seventh vias V7 on the base substrate 101 respectively at least partially overlap with the orthographic projections of the plurality of first definition walls PDL1 on the base substrate 101. For example, the orthographic projections of the plurality of seventh vias V7 on the base substrate 101 also respectively at least partially overlap with the orthographic projections of the plurality of pixel openings PO on the base substrate 101. Therefore, the ranges of the plurality of pixel openings PO respectively extend beyond the seventh vias V7, so as to achieve a larger opening area and improve the aperture ratio.

For example, FIGS. 6-16 respectively show a schematic planar view of each functional layer of the display substrate, and each functional layer of the display substrate is introduced below in combination with FIGS. 6-16.

For example, in the following embodiment, the case that each sub-pixel of the display substrate includes 11 pixel driving circuits, corresponding to 11 views, that is, the above-mentioned N is equal to 11 is taken as an example.

For example, in the arrangement of the pixel driving circuits, M columns of pixel driving circuits constitute a repetition unit, and the M columns of pixel driving circuits of at least one (for example, each) repetition unit share one reset voltage line and one reference voltage line, and M is a positive integer greater than 1. In the following embodiment, the case that M is equal to 24 is taken as an example. FIGS. 6-16 show one repetition unit of the display substrate, that is, 24 views, as an example.

For example, in some embodiments, as shown in FIGS. 6-16, at least part of the structures of two adjacent pixel driving circuits in the same row are symmetrically arranged.

Figure 6:
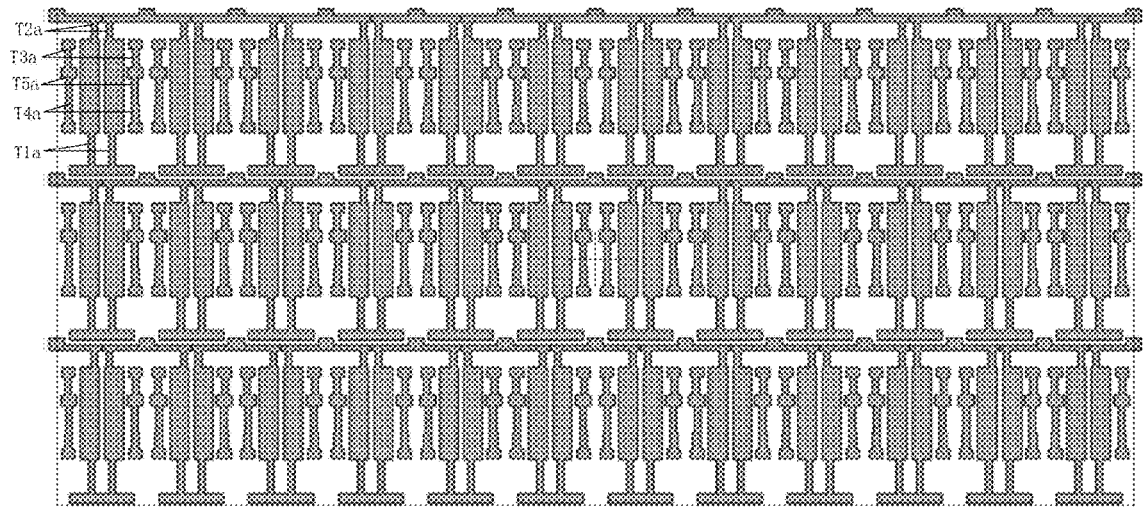
FIGS. 6-16 are schematic planar views of each functional layer of the display substrate provided by at least one embodiment of the present disclosure.

For example, FIG. 6 shows the semiconductor layer 102 of the display substrate, the semiconductor layer 102 includes active layers of a plurality of transistors, such as the first active layer T1a of the first transistor T1, the second active layer T2a of the second transistor T2, the third active layer T3a of the third transistor T3, the fourth active layer T4a of the fourth transistor T4 and the fifth active layer T5a of the fifth transistor T5.

For example, the patterns of the semiconductor layers 102 of two adjacent pixel driving circuits in the same row are symmetrically arranged.

Figure 7:
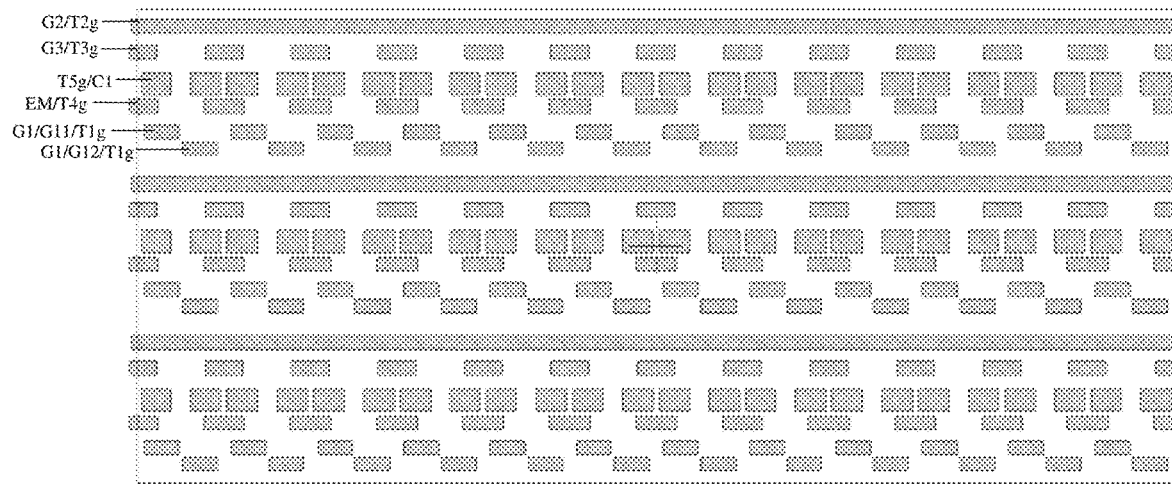

For example, FIG. 7 shows a schematic planar view of the first gate metal layer 103 of the display substrate. The first gate metal layer 103 includes the first gate electrode T1g of the first transistor T1, the second gate electrode T2g of the second transistor T2, the third gate electrode T3g of the third transistor T3, the fourth gate electrode T4g of the fourth transistor T4 and the fifth gate electrode T5g of the fifth transistor T5.

For example, the first gate electrode T1g is electrically connected with the first scanning signal line G1, so the first gate electrode T1g can also be a part of the first scanning signal line G1. The second gate electrode T2g is electrically connected with the second scanning signal line G2, so the second gate electrode T2g can also be a part of the second scanning signal line G2. The third gate electrode T3g is electrically connected with the third scanning signal line G3, so the third gate electrode T3g can also be a part of the third scanning signal line G3. The fourth gate electrode T4g is electrically connected with the light-emitting control signal line EM, so the fourth gate electrode T4g can also be a part of the light-emitting control signal line EM. The fifth gate electrode T5g can be used as the first capacitor electrode C1 at the same time, for example.

For example, the patterns of the first gate metal layers 103 of two adjacent pixel driving circuits in the same row are mostly symmetrically arranged.

Figure 8:
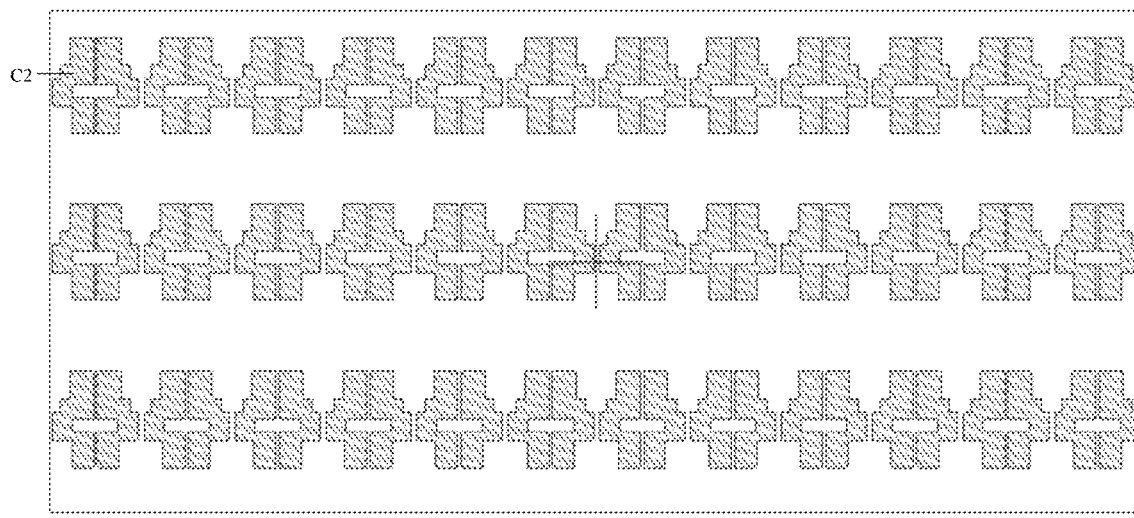

For example, FIG. 8 shows a schematic planar view of the second gate metal layer 104 of the display substrate. The second gate metal layer 104 includes the second capacitor electrode C2 of the first storage capacitor Cst, and the second capacitor electrode C2 and the first capacitor electrode C1 are overlapped with each other to form the first storage capacitor Cst.

For example, the patterns of the second gate metal layers 104 of two adjacent pixel driving circuits located in the same row are symmetrically arranged.

Figure 9:
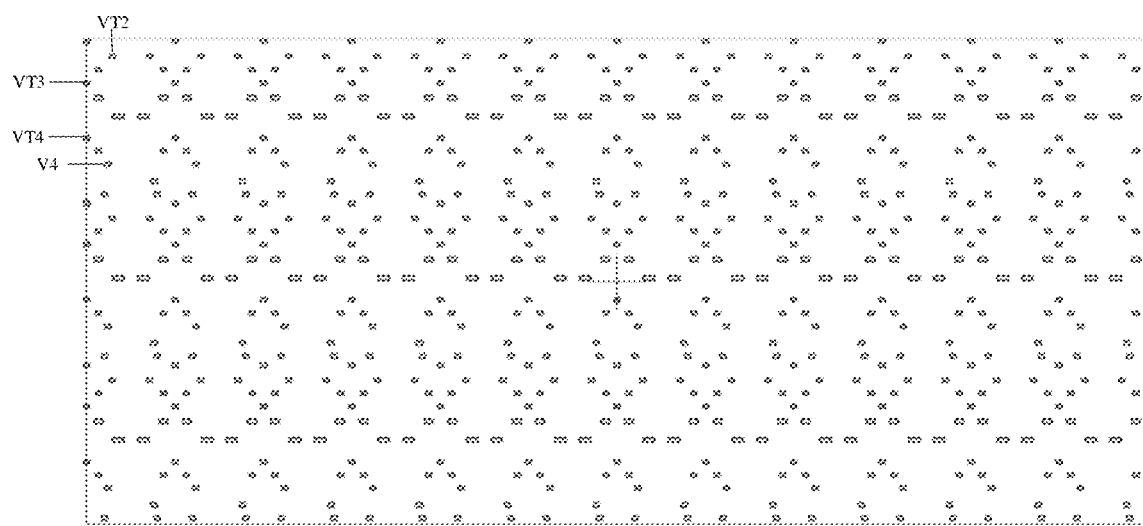

For example, FIG. 9 shows a schematic planar view of the interlayer insulation layer IDL of the display substrate. The interlayer insulation layer IDL includes a plurality of vias, such as the fourth via V4 configured to connect the first scanning signal line G1 with the first gate electrode T1g, the via VT2 configured to connect the second scanning signal line G2 with the second gate electrode T2g, the via VT3 configured to connect the third scanning signal line G3 with the third gate electrode T3g, the via VT4 configured to connect the light-emitting control signal line EM with the fourth gate electrode T4g, and the like.

Figure 10:
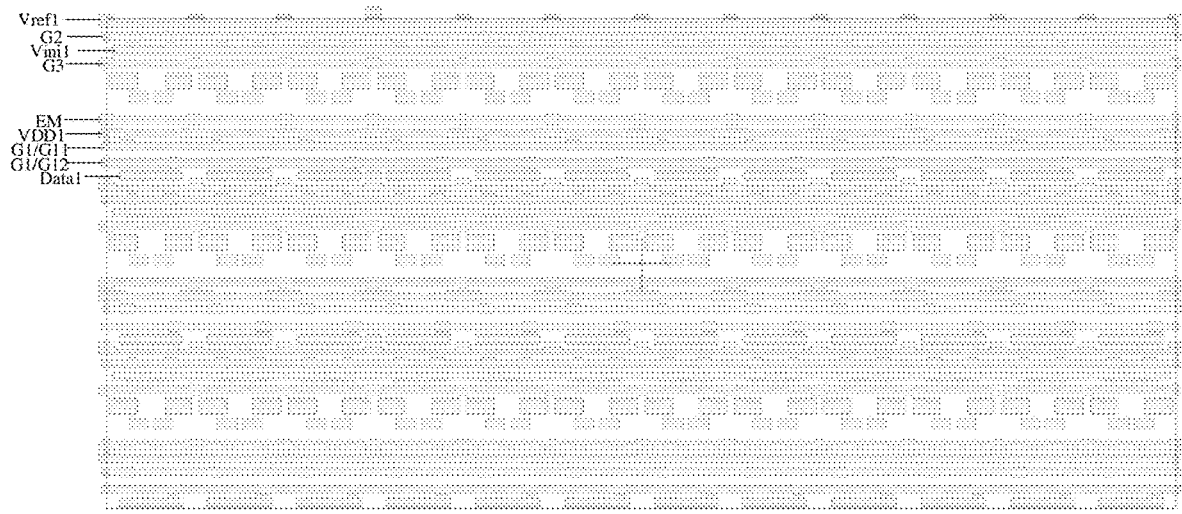

For example, FIG. 10 shows a schematic planar view of the first source-drain metal layer 105 of the display substrate. The first source-drain metal layer 105 includes the reference voltage connection line Vref1, the reset voltage connection line Vini1, the first power connection line VDD1, the data connection line Data1, the first scanning signal line G1, the second scanning signal line G2, the third scanning signal line G3, the light-emitting control signal line EM, and the first to the fifth source electrodes T1s~T5s and first to the fifth drain electrodes T1d~T5d of the first to fifth transistors T1~T5.

For example, the first scanning signal line G1 is electrically connected with the first gate electrode T1g through the fourth via V4, the second scanning signal line G2 is electrically connected with the second gate electrode T2g through the via VT2, the third scanning signal line G3 is electrically connected with the third gate electrode T3g through the via VT3, and the light-emitting control signal line EM is electrically connected with the fourth gate electrode T4g through the via VT4.

For example, the reference voltage connection line Vref1, the reset voltage connection line Vini1, the first power connection line VDD1, and the data connection line Data1 are respectively electrically connected with the corresponding signal lines through the vias in the first planarization layer PLN1 in the following.

For example, the patterns of the first source-drain metal layers 105 of two adjacent pixel driving circuits located in the same row are mostly symmetrically arranged.

Figure 11:
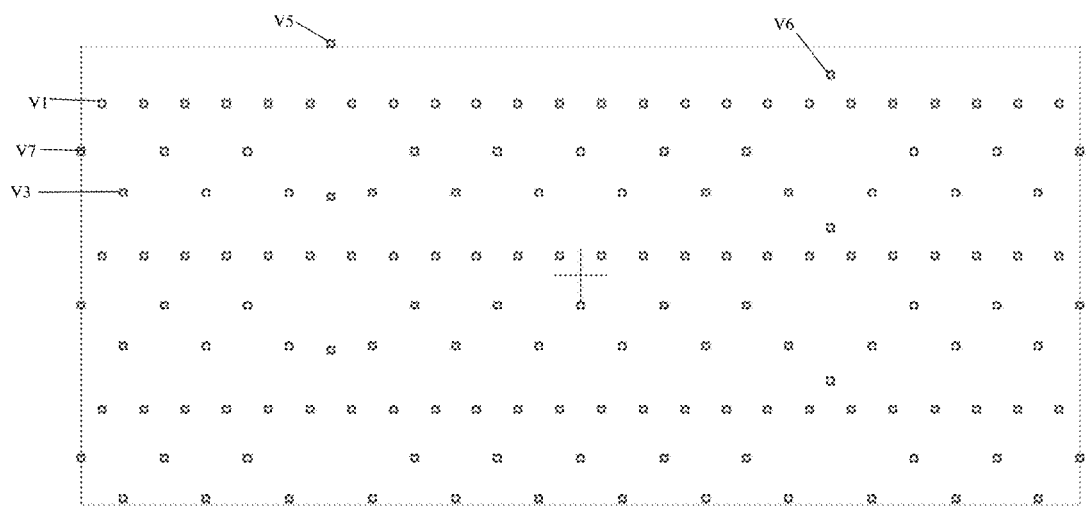

For example, FIG. 11 shows a schematic planar view of the first planarization layer PLN1 of the display substrate. The first planarization layer PLN1 includes a plurality of vias, such as the third via V3 configured to connect the data line Data with the data connection line Data1, the fifth via V5 configured to connect the reference voltage connection line Vref1 with the reference voltage line Vref, the sixth via V6 configured to electrically connect the reset voltage connection line Vini1 with the reset voltage line Vini, the seventh via V7 configured to electrically connect the first power connection line VDD1 with the first power line VDD, and the first via V1 configured to expose the output terminal of the pixel driving circuit D.

Figure 12:
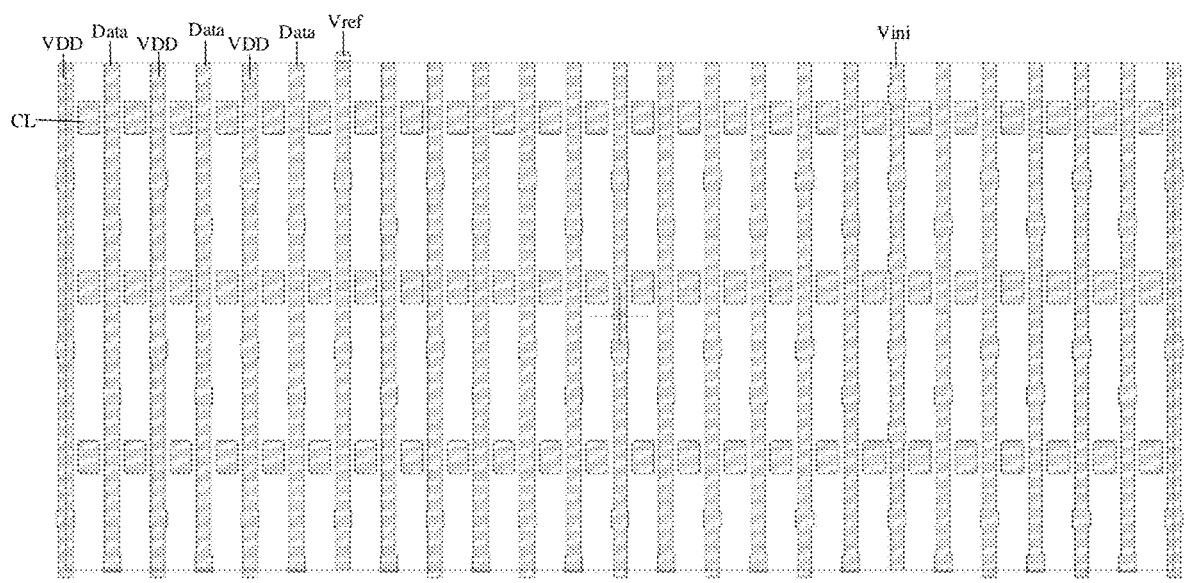

For example, FIG. 12 shows a schematic planar view of the first metal layer M1 of the display substrate. The first metal layer M1 is also the second source-drain metal layer of the display substrate. The first metal layer M1 includes a data line Data, a reference voltage line Vref, a first power line VDD, a reset voltage line Vini, and a connection electrode CL.

For example, the data line Data, the reference voltage line Vref, the first power line VDD and the reset voltage line Vini respectively extend in the first direction (the vertical direction in the figure), and a column of connection electrodes CL is arranged between every two selected from the group consisting of the data line Data, the reference voltage line Vref, the first power line VDD and the reset voltage line Vini.

For example, as shown in FIG. 12, in at least some columns of pixel driving circuits, first power lines VDD and Data lines data are alternately arranged. For example, every two adjacent columns of pixel driving circuits or every two adjacent views share one data line Data, and every 24 adjacent columns of pixel driving circuits or every 24 views share 10 first power lines VDD. For example, every adjacent 24 columns of sub-pixels or every 24 views share one reference voltage line Vref, and every adjacent 24 columns of sub-pixels or every 24 views share one reset voltage line Vini.

That is, in the embodiment shown in FIGS. 6-16, each sub-pixel includes 11 pixel driving circuits, corresponding to 11 views, because every two adjacent columns of pixel driving circuits or every two adjacent views share one data line Data, if the difference between the reference voltage line Vref and the reset voltage line Vini is ignored, every 12 columns of pixel driving circuits can constitute a repetition unit, and a plurality of repetition units are arranged in sequence on the base substrate 101; considering the connection relationship between the reference voltage line Vref and the reset voltage line Vini and the difference of the supplied electrical signals by the reference voltage line Vref and the reset voltage line Vini, in a strict sense, every 24 columns of pixel driving circuits can form a repetition unit, and a plurality of repetition units are arranged in sequence on the base substrate 101; in this case, every 24 columns of pixel driving circuits share one reference voltage line Vref and one reset voltage line Vini.

For example, the patterns of the first metal layers M1 of two adjacent pixel driving circuits in the same row are mostly symmetrically arranged.

For example, referring to FIG. 10, the data connection line Data1, the reference voltage connection line Vref1, the reset voltage connection line Vini1 and the first power connection line VDD1 respectively extend in the second direction (the horizontal direction in the figure) to introduce the electric signals transmitted by the data line Data, the reference voltage line Vref, the first power line VDD and the reset voltage line Vini to each pixel driving circuit in each row.

Figure 13:
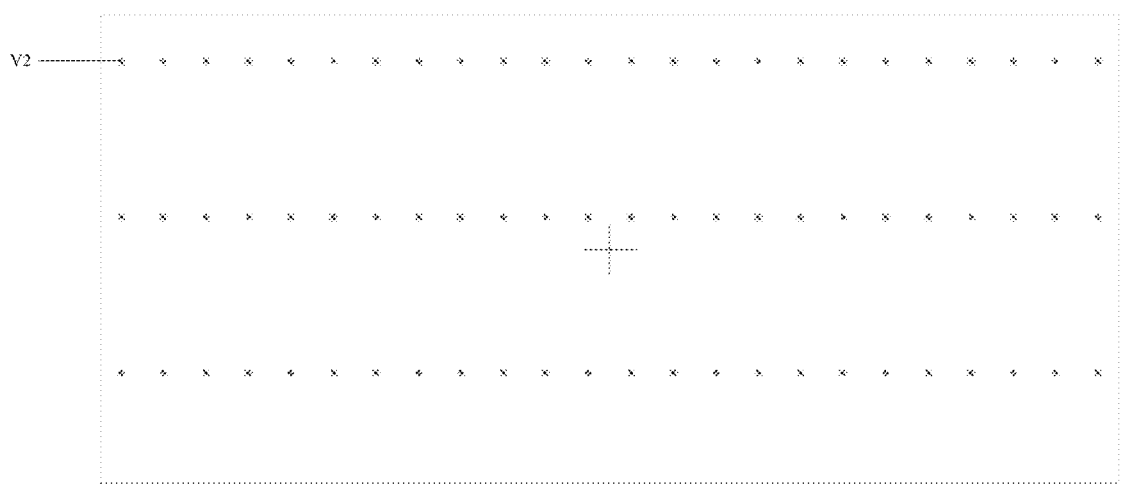

For example, FIG. 13 shows a schematic planar view of the second planarization layer PLN2 of the display substrate. As shown in FIG. 13, the second planarization layer PLN2 includes a plurality of second vias V2 exposing the connection electrodes CL, and the plurality of second vias V2 respectively expose the plurality of connection electrodes CL.

Figure 14:
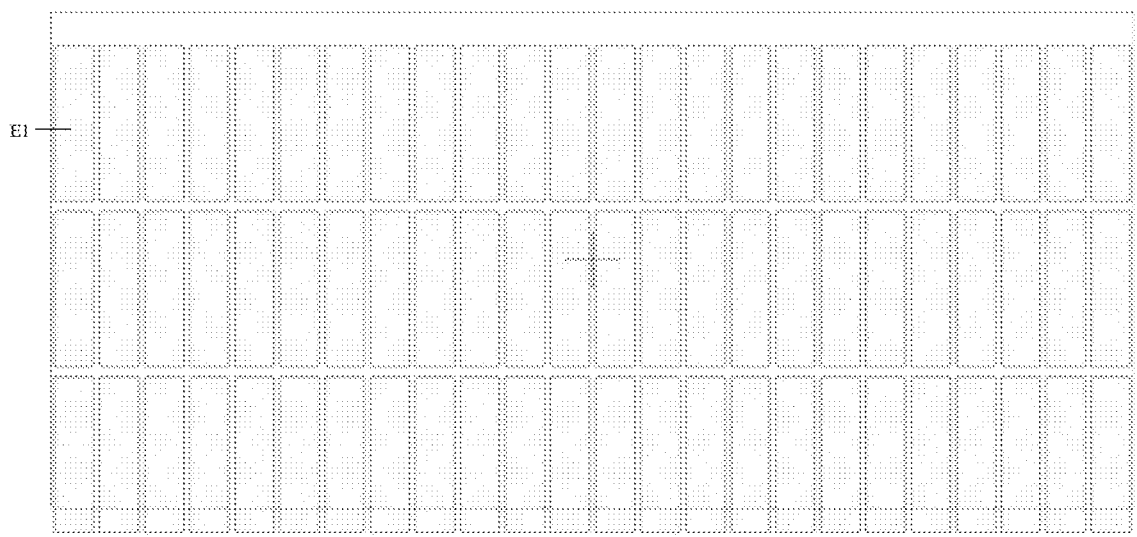

For example, FIG. 14 shows a schematic planar view of a plurality of first electrodes of the display substrate. As shown in FIG. 14, the plurality of first electrodes E1 are arranged at intervals, for example, each first electrode E1 is in a rectangular shape, and the plurality of first electrodes E1 are electrically connected with the plurality of connection electrodes CL through a plurality of second vias V2.

Figure 15:
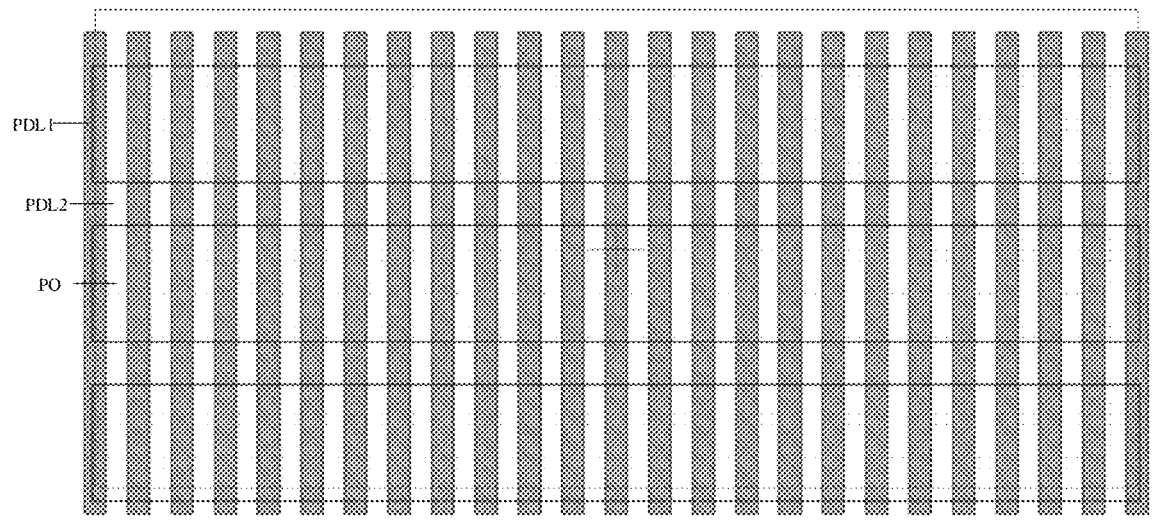

For example, FIG. 15 shows a schematic planar view of the pixel definition layer PDL of the display substrate. As shown in FIG. 15, the pixel definition layer PDL includes a plurality of first definition walls PDL1 extending in the first direction and a plurality of second definition walls PDL2 extending in the second direction to define a plurality of pixel openings PO. The plurality of pixel openings PO respectively expose the plurality of first electrodes E1, so that the light-emitting material layer E2 is formed in the plurality of pixel openings PO and contacts with the plurality of first electrodes E1.

Figure 16:
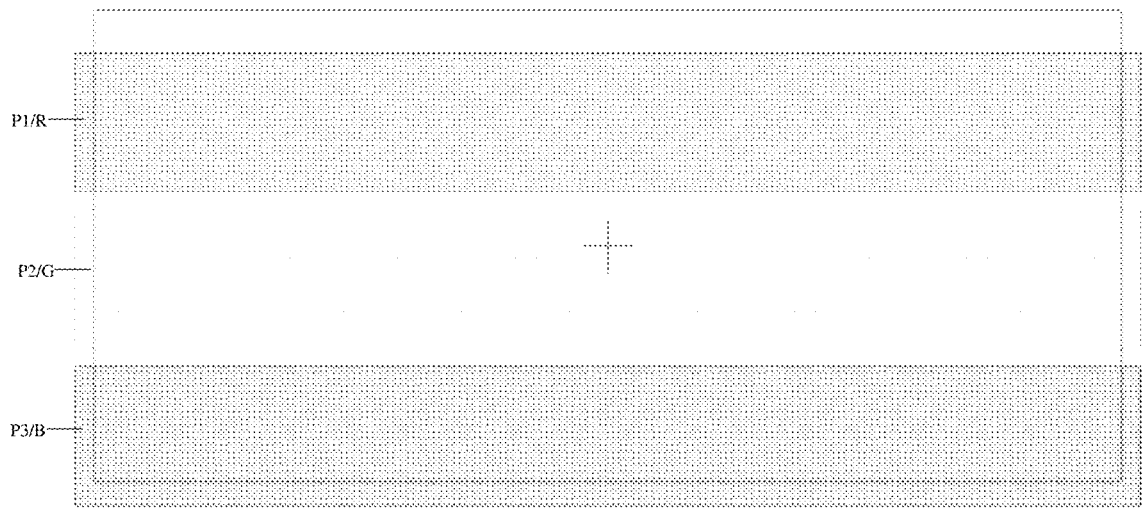

For example, FIG. 16 shows a schematic planar view of the light-emitting material layer E2 of the display substrate. As shown in FIG. 16, the light-emitting material layer E2 includes a plurality of light-emitting material rows. As an example, three light-emitting material rows P1/P2/P3 are shown in FIG. 16, the plurality of light-emitting material rows extend in the second direction (the horizontal direction in the figure), and the light-emitting materials of the plurality of light-emitting material rows are different and the plurality of light-emitting material rows are separated from each other by the plurality of second definition walls PDL2.

For example, structures, such as a second electrode layer E3, an encapsulation layer EN and the like, are provided on the light-emitting material layer E2, and these structures may be formed as integral surface structures in the display substrate, that is, each structure is in a shape of continuous sheet, which is not described in detail here.

Figure 17:
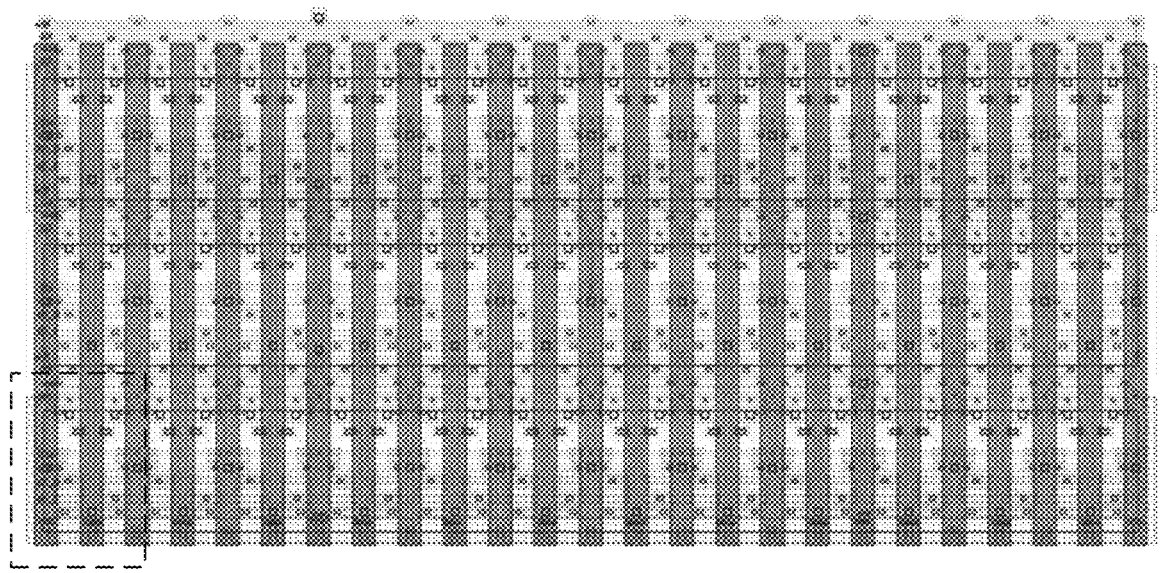
FIG. 17 is a schematic planar view of a stacked structure constituted by various functional layers of the display substrate provided by at least one embodiment of the present disclosure.

For example, FIG. 17 is a stacked structure constituted by the various functional layers in FIGS. 6-16, in which the dashed frame part is the part shown in FIG. 3.

For example, in the embodiments of the present disclosure, the base substrate 101 may be a flexible substrate or a rigid substrate. The rigid substrate may include but not limited to one or more selected from the group consisting of glass and quartz, and the flexible substrate may include but not limited to one or more selected from the group consisting of polyethylene terephthalate, ethylene terephthalate, polyether ether ketone, polystyrene, polycarbonate, polyaryl ester, polyarylate, polyimide, polyvinyl chloride, polyethylene and textile fiber. For example, in some examples, the flexible substrate may include a first flexible material layer, a first inorganic material layer, a semiconductor layer, a second flexible material layer and a second inorganic material layer that are stacked. The materials of the first flexible material layer and the second flexible material layer may be polyimide (PI), polyethylene terephthalate (PET) or a surface-treated polymer soft film, and the materials of the first inorganic material layer and the second inorganic material layer may be silicon nitride (SiNx) or silicon oxide (SiOx), etc., to improve the water-oxygen resistance ability of the base substrate.

For example, the material of the semiconductor layer 102 may be a semiconductor material, for example, a metal oxide, such as amorphous indium gallium zinc oxide (a-IGZO), zinc oxynitride (ZnON), indium zinc tin oxide (IZTO) or amorphous silicon (a-Si), polysilicon (p-Si), hexathiophene or polythiophene, and so on.

For example, the materials of the first gate metal layer 103, the second gate metal layer 104, the first source-drain metal layer 105 and the first metal layer M1 may be metal materials, such as any one or more selected from the group consisting of titanium (Ti), copper (Cu), aluminum (Al) and molybdenum (Mo), or alloy materials of the above metals, such as aluminum-neodymium alloy (AlNd) or molybdenum-niobium alloy (MoNb), each of the first gate metal layer 103, the second gate metal layer 104, the first source-drain metal layer 105 and the first metal layer M1 may be a single-layer structure, or a multi-layer composite structure, such as Mo/Cu/Mo, etc.

For example, the materials of the gate insulation layer G11, the gate insulation layer G12 and the interlayer insulation layer IDL may be any one or more selected from the group consisting of silicon oxide (SiOx), silicon nitride (SiNx) and silicon oxynitride (SiON), and each of the gate insulation layer G11, the gate insulation layer G12 and the interlayer insulation layer IDL may be a single-layer structure, a multi-layer structure or a composite layer structure.

For example, the first planarization layer PLN1 and the second planarization layer PLN2 may be made of organic materials, such as polyimide, resin, etc.

For example, the first electrode E1 of the light-emitting device EL may be made of a transparent metal oxide such as indium tin oxide (ITO), indium zinc oxide (IZO), gallium zinc oxide (GZO), and the like, or may be a stacked structure constituted by transparent metal oxide(s) and metal(s) (such as silver), and the second electrode E3 may be made of a metal material such as lithium (Li), aluminum (Al), magnesium (Mg), silver (Ag), and the like.

For example, the encapsulation layer EN may be a stacked structure constituted by the organic material(s) and the inorganic material(s), the organic material(s) may be polyimide, resin, etc., and the inorganic material(s) may be silicon oxide (SiOx), silicon nitride (SiNx) or silicon oxynitride (SiON), etc. The embodiments of the present disclosure do not limit the specific materials of the above functional layers.

At least one embodiment of the present disclosure provides a display device, the display device includes the display substrate provided by the embodiments of the present disclosure. For example, the display device may be a mobile phone, a tablet computer, a television, a display, a laptop, a digital photo frame, a navigator and any other products or components with display functions.

The following statements should be noted:
(1) The accompanying drawings involve only the structure(s) in connection with the embodiment(s) of the present disclosure, and other structure(s) can be referred to common design(s).
(2) For the purpose of clarity only, in accompanying drawings for illustrating the embodiment(s) of the present disclosure, the thickness of a layer or a region may be enlarged or narrowed, that is, the drawings are not drawn in a real scale. However, it should understood that, in the case in which a component such as a layer, a film, a region, a substrate or the like is referred to be "on" or "under" another component, the component may be directly on or under the another component or there may be an intermediate component.
(3) In case of no conflict, the embodiments of the present disclosure and the features in the embodiments can be combined with each other to obtain new embodiments.

What have been described above are only specific implementations of the present disclosure, the protection scope of the present disclosure is not limited thereto, and the protection scope of the present disclosure should be based on the protection scope of the claims.

The invention claimed is:
1. A display substrate, comprising:
a base substrate,
a pixel driving circuit layer, on the base substrate and comprising a plurality of pixel driving circuits,
a first planarization layer, on a side of the pixel driving circuit layer away from the base substrate, and comprising a plurality of first vias respectively exposing output terminals of the plurality of pixel driving circuits,
a first metal layer, on a side of the first planarization layer away from the base substrate, and comprising a plurality of data lines extending in a first direction and a plurality of connection electrodes, wherein the plurality of connection electrodes are electrically connected with the output terminals of the plurality of pixel driving circuits through the first vias respectively,
a second planarization layer, on a side of the first metal layer away from the base substrate and comprising a plurality of second vias exposing the plurality of connection electrodes,
a plurality of first electrodes, on a side of the second planarization layer away from the base substrate, and electrically connected with the plurality of connection electrodes through the plurality of second vias respectively, and a pixel definition layer, on a side of the plurality of first electrodes away from the base substrate and comprising a plurality of first definition walls extending in the first direction and a plurality of second definition walls extending in a second direction, wherein the plurality of first definition walls and the plurality of second definition walls define a plurality of pixel openings, and the first direction is different from the second direction, wherein an orthographic projection of at least part of the plurality of data lines on the base substrate respectively at least partially overlaps with orthographic projections of the plurality of first definition walls on the base substrate.

2. The display substrate according to claim 1, further comprising:

a plurality of data connection lines, electrically connected with the plurality of data lines and the plurality of pixel driving circuits respectively, wherein the plurality of data lines are electrically connected with the plurality of data connection lines through a plurality of third vias, and orthographic projections of the plurality of third vias on the base substrate respectively at least partially overlap with orthographic projections of the plurality of pixel openings on the base substrate.

3. The display substrate according to claim 1, wherein orthographic projections of the plurality of first vias on the base substrate are respectively within orthographic projections of the plurality of pixel openings on the base substrate; or orthographic projections of the plurality of first vias on the base substrate are respectively within orthographic projections of the plurality of second definition walls on the base substrate.

4. The display substrate according to claim 1, wherein orthographic projections of the plurality of second vias on the base substrate are respectively within orthographic projections of the plurality of second definition walls on the base substrate.

5. The display substrate according to claim 1, wherein in a direction perpendicular to the base substrate, a height of the plurality of first definition walls is smaller than a height of the plurality of second definition walls.

6. The display substrate according to claim 1, further comprising:

a light-emitting material layer, at least in the plurality of pixel openings and comprising a plurality of light-emitting material rows with different colors, wherein the plurality of light-emitting material rows extend in the second direction and are separated from each other by the plurality of second definition walls.

7. The display substrate according to claim 2, wherein each of the plurality of pixel driving circuits comprises a first thin film transistor and a first storage capacitor, the first thin film transistor comprises a first gate electrode, a first source electrode and a first drain electrode, and the first storage capacitor comprises a first capacitor electrode and a second capacitor electrode, the first gate electrode is electrically connected with a first scanning signal line, the first source electrode is electrically connected with one of the plurality of data lines, the first drain electrode is electrically connected with the first capacitor electrode, and the second capacitor electrode is electrically connected with one of the plurality of first electrodes.

8. The display substrate according to claim 7, wherein the first gate electrode and the first capacitor electrode are in a same layer on the base substrate, the display substrate further comprises a gate insulation layer on a side of both the first gate electrode and the first capacitor electrode away from the base substrate, the second capacitor electrode is on a side of the gate insulation layer away from the base substrate, the display substrate further comprises an interlayer insulation layer on a side of the second capacitor electrode away from the base substrate, the first source electrode and the first drain electrode are on a side of the interlayer insulation layer away from the base substrate, and the first planarization layer is on a side of both the first source electrode and the first drain electrode away from the base substrate.

9. The display substrate according to claim 8, wherein the plurality of data connection lines are in a same layer as the first source electrode and the first drain electrode;

the first scanning signal line is in a same layer as the first source electrode and the first drain electrode.

10. The display substrate according to claim 9, wherein the first scanning signal line is electrically connected with the first gate electrode through a fourth via, an orthographic projection of the fourth via on the base substrate is within orthographic projections of the plurality of pixel openings on the base substrate.

11. The display substrate according to claim 8, wherein each of the plurality of pixel driving circuits further comprises a second thin film transistor, the second thin film transistor comprises a second gate electrode, a second source electrode and a second drain electrode, the second gate electrode is electrically connected with a second scanning signal line, the second source electrode is electrically connected with the first drain electrode and the first capacitor electrode, the second drain electrode is electrically connected with a reference voltage line, and the reference voltage line is arranged in the first metal layer and extends in the first direction.

12. The display substrate according to claim 11, further comprising:

a reference voltage connection line, respectively electrically connected with the reference voltage line and the second drain electrode, wherein the reference voltage connection line is in a same layer as the first source electrode and the first drain electrode;

the reference voltage connection line is electrically connected with the reference voltage line through a fifth via, an orthographic projection of the fifth via on the base substrate at least partially overlaps with orthographic projections of the plurality of first definition walls on the base substrate.

13. The display substrate according to claim 11, wherein each of the plurality of pixel driving circuits further comprises a third thin film transistor, the third thin film transistor comprises a third gate electrode, a third source electrode and a third drain electrode, the third gate electrode is electrically connected with a third scanning signal line, the third source electrode is electrically connected with the second capacitor electrode and one of the plurality of first electrodes,
the third drain electrode is electrically connected with a reset voltage line, and
the reset voltage line is in the first metal layer and extends in the first direction.

14. The display substrate according to claim 13, further comprising:
a reset voltage connection line, electrically connected with the reset voltage line and the third drain electrode respectively,
wherein the reset voltage connection line is in a same layer as the first source electrode and the first drain electrode;
the reset voltage connection line is electrically connected with the reset voltage line through a sixth via,
an orthographic projection of the sixth via on the base substrate at least partially overlaps with orthographic projections of the plurality of second definition walls on the base substrate.

15. The display substrate according to claim 13, wherein each of the plurality of pixel driving circuits further comprises a fourth thin film transistor and a fifth thin film transistor, the fourth thin film transistor comprises a fourth gate electrode, a fourth source electrode and a fourth drain electrode, and the fifth thin film transistor comprises a fifth gate electrode, a fifth source electrode and a fifth drain electrode,
the fourth gate electrode is electrically connected with a light-emitting control line,
the fourth source electrode is electrically connected with the fifth drain electrode,
the fourth drain electrode is electrically connected with a first power line,
the fifth gate electrode is electrically connected with the first drain electrode and the first capacitor electrode,
the fifth source electrode is electrically connected with the second capacitor electrode and one of the plurality of first electrodes;
the first power line is in the first metal layer and extends in the first direction.

16. The display substrate according to claim 15, further comprising:
a first power connection line, electrically connected with the first power line and the fourth drain electrode respectively,
wherein the first power connection line is in a same layer as the first source electrode and the first drain electrode;
the first power connection line is electrically connected with the first power line through a seventh via,
an orthographic projection of the seventh via on the base substrate at least partially overlaps with orthographic projections of the plurality of first definition walls on the base substrate.

17. The display substrate according to claim 1, wherein at least part of structures of two adjacent pixel driving circuits in a same row are symmetrically arranged.

18. The display substrate according to claim 1, further comprising a plurality of sub-pixels,
wherein at least one of the sub-pixels comprises N pixel driving circuits in a same row, and the N pixel driving circuits correspond to N views, and N is a positive integer greater than 1.

19. The display substrate according to claim 18, wherein M columns of pixel driving circuits constitute a repetition unit, the M columns of pixel driving circuits of at least one repetition unit share one reset voltage line and one reference voltage line, and M is a positive integer greater than 1.

20. A display device, comprising the display substrate according to claim 1.

* * * * *